(12) United States Patent
Qiao et al.

(10) Patent No.: US 11,855,203 B2
(45) Date of Patent: Dec. 26, 2023

(54) POWER SEMICONDUCTOR DEVICE

(71) Applicant: University of Electronic Science and Technology of China, Chengdu (CN)

(72) Inventors: Ming Qiao, Chengdu (CN); Liu Yuan, Chengdu (CN); Zhao Wang, Chengdu (CN); Wenliang Liu, Chengdu (CN); Bo Zhang, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 177 days.

(21) Appl. No.: 17/367,442

(22) Filed: Jul. 5, 2021

(65) Prior Publication Data
US 2022/0367712 A1 Nov. 17, 2022

(30) Foreign Application Priority Data

May 17, 2021 (CN) .......................... 202110533706.4

(51) Int. Cl.
*H01L 29/78* (2006.01)
*H01L 29/06* (2006.01)
*H01L 29/10* (2006.01)
*H01L 29/40* (2006.01)

(52) U.S. Cl.
CPC ...... *H01L 29/7824* (2013.01); *H01L 29/0696* (2013.01); *H01L 29/1095* (2013.01); *H01L 29/402* (2013.01)

(58) Field of Classification Search
CPC ............. H01L 29/0619; H01L 29/0623; H01L 29/0653; H01L 29/0696; H01L 29/06; H01L 29/0878; H01L 29/08; H01L 29/1095; H01L 29/10; H01L 29/402; H01L 29/404; H01L 29/40; H01L 29/66681; H01L 29/66; H01L 29/7824; H01L 29/78
USPC .......................................................... 257/347
See application file for complete search history.

(56) References Cited

U.S. PATENT DOCUMENTS

2014/0070315 A1* 3/2014 Levy ..................... H01L 21/266
438/286

FOREIGN PATENT DOCUMENTS

CN 103474466 * 12/2013

* cited by examiner

*Primary Examiner* — Fazli Erdem
(74) *Attorney, Agent, or Firm* — Bayramoglu Law Offices LLC

(57) ABSTRACT

A power semiconductor device includes a P-type substrate, an N-type well region, a P-type body region, a gate oxide layer, a polysilicon gate, a first oxide layer, a first N+ contact region, a first P+ contact region, drain metal, a first-type doped region, and a gate oxide layer. An end of the P-type body region is flush with or exceeds an end of the polysilicon gate, wherein $C_{gd}$ of the power semiconductor device is reduced and a switching frequency of the power semiconductor device is increased. A polysilicon field plate connected with a source is introduced over a drift region that is not only shield an influence of the polysilicon gate on the drift region, thereby eliminating $C_{gd}$ caused by overlapping of traditional polysilicon gate and drift region, but also enable the power semiconductor device to have strong robustness against an hot carrier effect.

18 Claims, 5 Drawing Sheets

POWER SEMICONDUCTOR DEVICE

CROSS REFERENCE TO THE RELATED APPLICATIONS

This application is based upon and claims priority to Chinese Patent Application No. 202110533706.4 filed on May 17, 2021, the entire contents of which are incorporated herein by reference.

TECHNICAL FIELD

The present invention belongs to the technical field of power semiconductor devices, and specifically relates to a power semiconductor device.

BACKGROUND

LDMOS devices are commonly used in power integrated circuits such as AC-DC, DC-DC, high voltage gate drive and LED lighting. Generally, LDMOS needs low on-resistance and high switching frequency while meeting high withstand voltage. For devices with higher voltage, such as around 600V, the on-resistance is dominant, and its on-loss is higher and the switching frequency is lower, usually ranging from tens of kilohertz to hundreds of kilohertz, while the switching frequency of devices with operating voltage lower than tens of volts can reach up to megahertz or tens of megahertz. For example, a device with an operating voltage of 1.8V can have an operating frequency up to 20 MHz. With the rise of fast charging and other markets, people have increasingly high requirements for isolation transformers, and the frequency requirements for higher voltage grade devices are gradually increasing. Because the on-loss and off-state loss under normal operation of the device can be optimized, people gradually begin to pay attention to the switching loss of the device, and pay more attention to the dynamic parameters such as $Q_g$ and $C_{iss}$ of the device in hard switching.

For the traditional LDMOS device structure, polysilicon gate usually covers part of the drift region to form an accumulation region. This structure can not only eliminate the broken ditch phenomenon, but also form an accumulation layer on the surface of the drift region, thereby reducing the on-resistance of the device. However, the overlap between polysilicon gate and drift region also leads to the increase of the $C_{gd}$ of the device, so the input capacitance of the device increases and the switching frequency decreases. In the LDMOS structure of the present invention, the end of the body region is flush with or exceeds the end of the polysilicon gate. This design reduces the $C_{gd}$ of the device and improves the switching frequency of the device. In addition, by introducing the polysilicon field plate connected with the source over the drift region of LDMOS, the influence of the polysilicon gate on the drift region is shielded, the $C_{gd}$ of the device is further reduced, and the robustness of the device against the hot carrier effect can be increased at the same time. Furthermore, additional doping is introduced on the surface of the drift region below the polysilicon field plate to form an accumulation layer, which effectively solve the problem of increased on-resistance of the device caused by the polysilicon field plate connected to the source.

SUMMARY

The present invention is intended to provide a power semiconductor device. An interface between the body region and the drift region of the power semiconductor device is flush or exceeds the end of the polysilicon gate; in addition, a polysilicon field plate connected with the source is introduced over the drift region, and additional doping is introduced on the surface of the drift region below the polysilicon field plate. Compared with the traditional LDMOS structure, firstly, the design that the end of the body region is flush or exceeds the end of the polysilicon gate effectively reduces the $C_{gd}$ of the device, in addition, the added polysilicon field plate connected with the source not only shields the influence of the polysilicon gate on the drift region, further reduces the $C_{gd}$ of the device, but also makes the surface of the drift region below the device form a depletion layer when it is on, thereby affecting the current path. The advantage is that it can significantly reduce the hot carrier effect of the device. However, it also leads to the increase of the on-resistance of the device. Aiming at this phenomenon of increasing on-resistance, the invention introduces additional doping on the surface of the drift region below the polysilicon field plate to form an accumulation region, which effectively weakens the phenomenon of increasing on-resistance of the device caused by the polysilicon field plate. In summary, the present invention realizes an LDMOS device with low gate charge and strong robustness against the hot carrier effect without sacrificing the on-resistance of the device basically.

In order to achieve the above invention purpose, the technical scheme of the present invention is as follows:

A power semiconductor device, comprising: a p-type substrate 10, an N-type well region 4 located over the p-type substrate 10, a p-type body region 3 located on the left side surface of the N-type well region 4, the first N+ contact region 1 and the first P+ contact region 2 are adjacent and both located on the surface of the p-type body region 3, an another first N+ contact region 1 is located on the right side surface of the N-type well region 4, a gate oxide layer 16 is located over the p-type body region 3 and the N-type well region 4, the right side of the gate oxide layer 16 is tangent or not in contact with the left side of the first oxide layer 13, and a polysilicon gate 14 is located over the gate oxide layer 16, a first oxide layer 13 is located on the surface of the N-type well region 4, the first N+ contact region 1, the first P+ contact region 2 is shorted through source metal 11, a drain metal 12 is connected to the first N+ contact region 1 on the right side surface of the N-type well region 4, and a first-type doped region 5 is located on the surface of the N-type well region 4 and below the gate oxide layer 16.

In a preferred manner, a polysilicon field plate 15 is located over the gate oxide layer 16 between the p-type body region 3 and the first oxide layer 13; the polysilicon field plate 15 is shorted with the first N+ contact region 1 and the first P+ contact region 2 through the source metal 11.

In a preferred manner, the right boundary of the p-type body region 3 is flush with the right boundary of the polysilicon gate 14 or exceeds the right boundary of the polysilicon gate 14.

In a preferred manner, the source metal 11 is directly connected to the gate oxide layer 16.

In a preferred manner, the first type doped region 5 is formed jointly by multiple implantations.

In a preferred manner, the first-type doped region 5 is formed by multiple ion implantations with different energies and doses.

In a preferred manner, the first-type doped region 5 comprises a separated first-type doped region 5 formed by two implantations, and a second-type doped region 6 is implanted in the middle of the separated first-type doped regions 5.

In a preferred manner, implanting another first-type doped region 5 over the first-type doped region 5 and the second-type doped region 6 formed by two implantations.

In a preferred manner, a p-type well region 7 is implanted on the right side of the first type doped region 5, and a first P+ contact region 2 is implanted inside the p-type well region 7; the first N+ contact region 1 and the first P+ contact region 2 located within the p-type body region 3 are shorted with the first P+ contact region 2 located within the p-type well region 7 through the source metal 11.

In a preferred manner, polysilicon field plate 15 is located over the first oxide layer 13; the polysilicon field plate 15 is shorted with the first N+ contact region 1 and the first P+ contact region 2 through the source metal 11.

In a preferred manner, a first buried layer 8 is added inside the p-type body region 3 and below the first N+ contact region 1 and the first P+ contact region 2.

In a preferred manner, a polysilicon field plate 15 is provided over the gate oxide layer 16 between the p-type body region 3 and the first oxide layer 13; a polysilicon field plate 15 is provided over the first oxide layer 13; the two polysilicon field plates 15 are shorted with the first N+ contact area 1 and the first P+ contact area 2 through the source metal 11.

In a preferred manner, a first type drift region implantation 9 is provided on the right side of the first type doped region 5 and below the first oxide layer 13.

In a preferred manner, the substrate is a bulk silicon substrate or an SOI substrate.

The beneficial effects of the present invention are: first of all, the right boundary of the body region in the present invention is flush with or exceeds the right boundary of the polysilicon gate, and the $C_{gd}$ of the device is effectively reduced under the condition that the device can be turned on smoothly, and by introducing a polysilicon field plate connected to the source over the drift region, the present invention not only shields the influence of the polysilicon gate on the drift region, further reduces the $C_{gd}$ of the device, but also significantly reduces the hot carrier effect of the LDMOS. Furthermore, the present invention introduces additional doping on the surface of the drift region under the polysilicon field plate, which effectively weakens the effect of the on-resistance reduction of the device caused by the polysilicon field plate connected to the source. In summary, the present invention realizes an LDMOS device with low gate charge and strong robustness against the hot carrier effect without sacrificing the on-resistance of the device basically.

where, in the figures, 1 is a first N+ contact region, 2 is a first P+ contact region, 3 is a p-type body region, 4 is a N-type well region, 5 is a first-type doped region, 6 is a second-type doped region, and 7 is a p-type well region, 8 is a first-type buried layer, 9 is a first-type drift region implantation, 10 is a p-type substrate, 11 is a source metal, 12 is a drain metal, 13 is a first oxide layer, and 14 is a polysilicon gate, 15 is a polysilicon field plate, and 16 is a gate oxide layer.

DETAILED DESCRIPTION OF THE EMBODIMENTS

Through specific examples of the present invention below, technicians of the field can easily understand other advantages and efficacies of the present invention revealed by the specification. The present invention can also be implemented or applied through other different ways, and the details of the specification can also be modified or changed based on different views and applications without deviating from the spirit of the present invention.

Embodiment 1

Figure 1A:
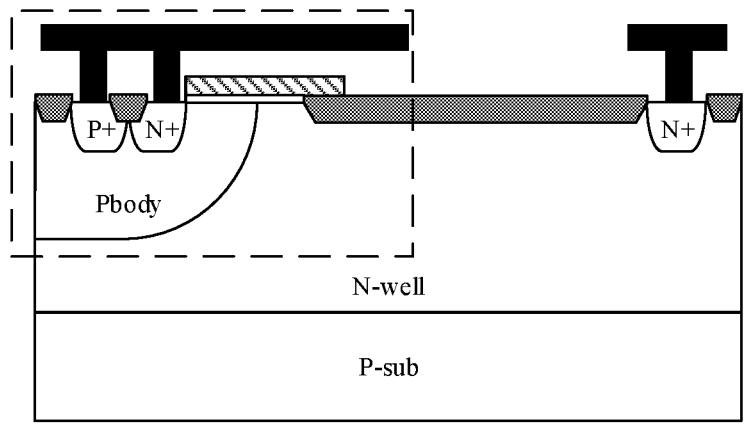
FIG. 1A is a traditional LDMOS longitudinal cross-sectional view structure.
Figure 1B:
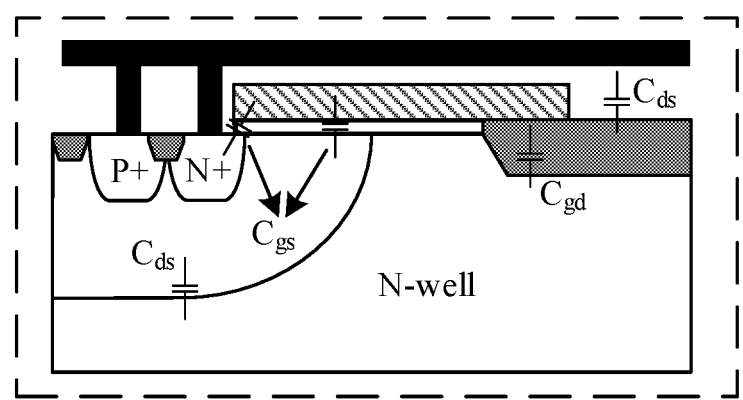
FIG. 1B is the capacitance composition diagram of the box portion in FIG. 1A.
Figure 2:
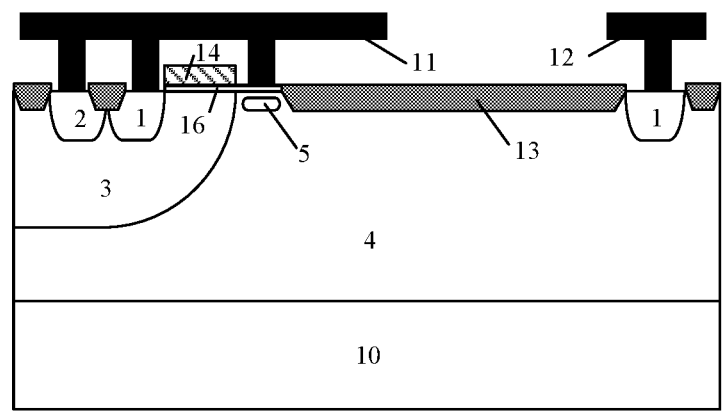
FIG. 2 is a longitudinal cross-sectional view of Embodiment 1 of an integratable semiconductor device provided by the present invention.

A power semiconductor device provided in this embodiment is shown in FIG. 2:

Comprising a p-type substrate 10, an N-type well region 4 located over the p-type substrate 10, a p-type body region 3 located on the left side surface of the N-type well region 4, the first N+ contact region 1 and the first P+ contact region 2 are adjacent and both located on the surface of the p-type body area 3, the other first N+ contact region 1 is located on the right side surface of the N-type well region 4, the right side of the gate oxide layer 16 is tangent or not in contact with the left side of the first oxide layer 13, and polysilicon gate 14 is located over the gate oxide layer 16, first oxide layer 13 is located on the surface of the N-type well region 4, the first N+ contact region 1, the first P+ contact region 2 is shorted through source metal 11, drain metal 12 is connected to the first N+ contact region 1 located on the right side surface of the N-type well region 4, and the first-type doped region 5 is located on the surface of the N-type well region 4 and below the gate oxide layer 16. The right boundary of the P-type body region 3 is flush with the right boundary of the polysilicon gate 14. The substrate is a bulk silicon substrate or an SOI substrate.

The source metal 11 is directly connected to the gate oxide layer 16.

The advantage of this embodiment is that the robustness of the device against hot carrier effect can be further improved.

Embodiment 2

Figure 3:
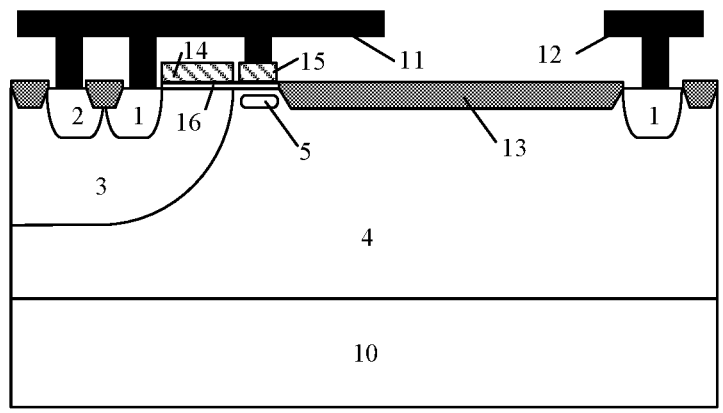
FIG. 3 is a longitudinal cross-sectional view of Embodiment 2 of an integratable semiconductor device provided by the present invention.

As shown in FIG. 3, the difference between this embodiment and embodiment 1 lies in that:

Polysilicon field plate 15 is located over the gate oxide layer 16 between the p-type body region 3 and the first oxide layer 13; the polysilicon field plate 15 is shorted with the first N+ contact region 1 and the first P+ contact region 2 through the source metal 11.

The advantage of this embodiment lies in the low difficulty in process realization and better compatibility with traditional processes.

Embodiment 3

Figure 4:
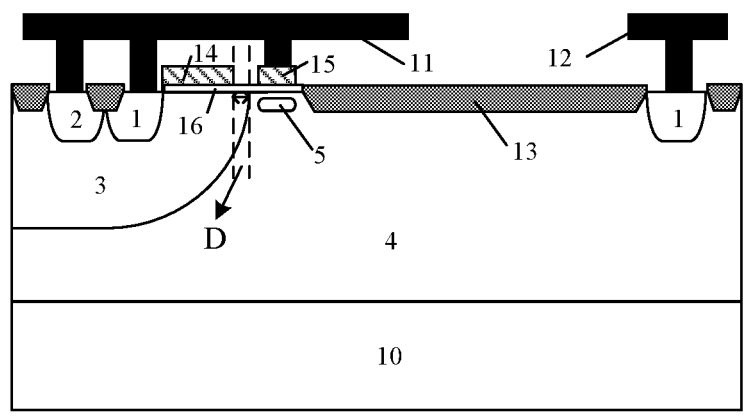
FIG. 4 is a longitudinal cross-sectional view of Embodiment 3 of an integratable semiconductor device provided by the present invention.

As shown in FIG. 4, the difference between this embodiment and embodiment 2 lies in that: the right boundary of the P-type body region 3 exceeds the right boundary of the polysilicon gate 14.

In this case, the device can still be an enhanced device and can be turned on smoothly, the advantage of this embodiment is that the input capacitance of the device can be further reduced and the switching frequency can be increased.

Embodiment 4

Figure 5:
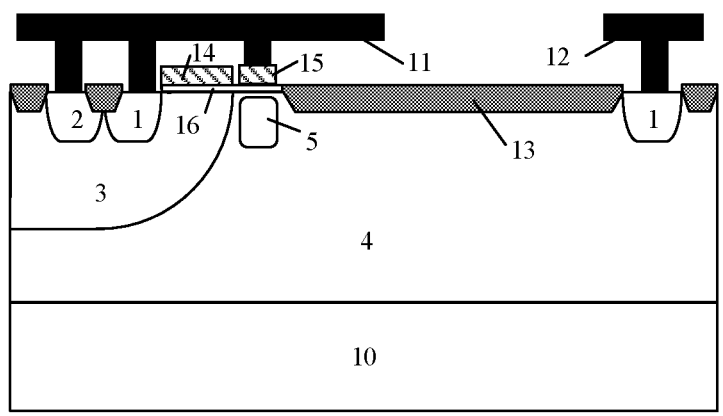
FIG. 5 is a longitudinal cross-sectional view of Embodiment 4 of an integratable semiconductor device provided by the present invention.

As shown in FIG. 5, the difference between this embodiment and embodiment 2 lies in that: the first type doped region 5 is formed jointly by multiple implantations. The advantage of this embodiment is that the adverse effect of the polysilicon field plate 15 on the on-resistance of the device can be further reduced.

Embodiment 5

Figure 6:
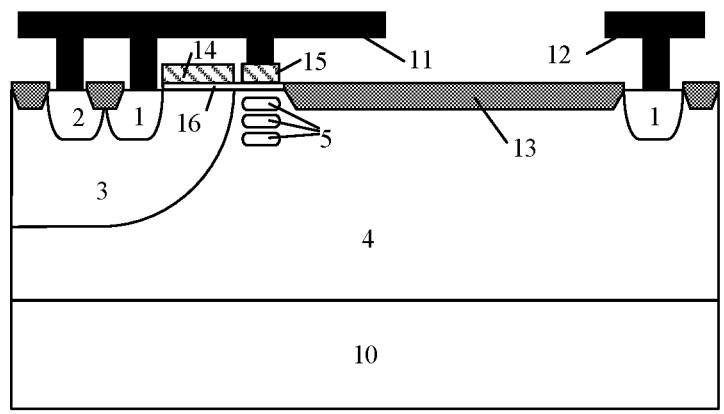
FIG. 6 is a longitudinal cross-sectional view of Embodiment 5 of an integratable semiconductor device provided by the present invention.

As shown in FIG. 6, the difference between this embodiment and embodiment 2 lies in that the first-type doped region 5 is formed by multiple ion implantations with different energies and doses. The advantage of this embodiment is that the adverse effect of the polysilicon field plate 15 on the on-resistance of the device can be further reduced Embodiment 6

Figure 7:
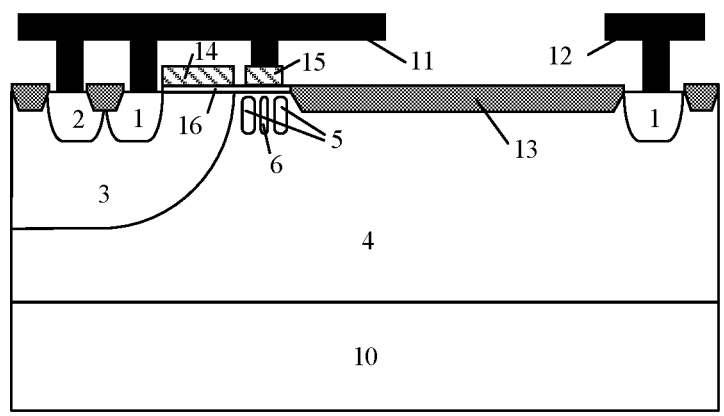
FIG. 7 is a longitudinal cross-sectional view of Embodiment 6 of an integratable semiconductor device provided by the present invention.

As shown in FIG. 7, the difference between this embodiment and embodiment 2 lies in that the first-type doped region 5 comprises a separated first-type doped regions 5 formed by two implantations, and a second-type doped region 6 is implanted in the middle of the separated first-type doped regions 5. The advantage of this embodiment is that the adverse effect of the polysilicon field plate 15 on the on-resistance of the device can be further reduced.

Embodiment 7

Figure 8:
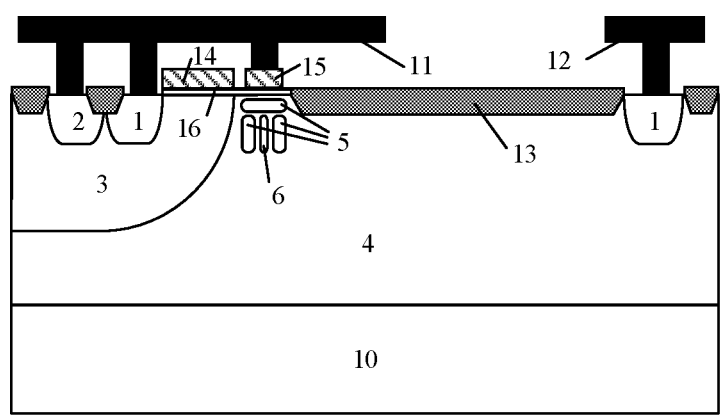
FIG. 8 is a longitudinal cross-sectional view of Embodiment 7 of an integratable semiconductor device provided by the present invention.

As shown in FIG. 8, the difference between this embodiment and embodiment 6 lies in that: implanting another first-type doped region 5 over the first-type doped region 5 formed by two implantations and the second-type doped region 6. The advantage of this embodiment is that the current path can be further optimized and the adverse effect of the polysilicon field plate 15 on the on-resistance of the device can be further reduced.

Embodiment 8

Figure 9:
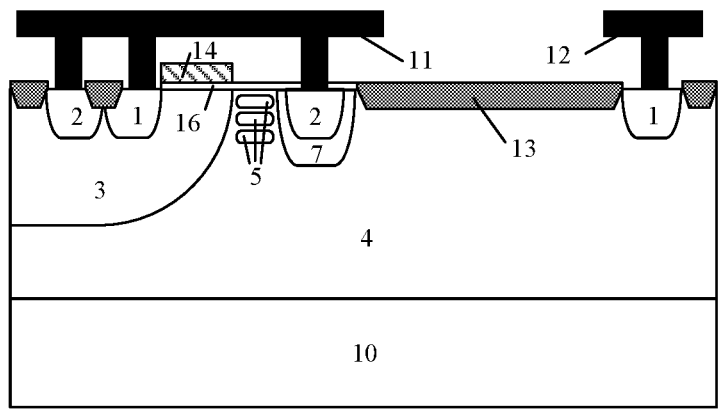
FIG. 9 is a longitudinal cross-sectional view of Embodiment 8 of an integratable semiconductor device provided by the present invention.

As shown in FIG. 9, the difference between this embodiment and embodiment 1 lies in that the first-type doped region 5 is formed by multiple ion implantations with different energies and doses. A p-type well region 7 is implanted on the right side of the first type doped region 5, and a first P+ contact region 2 is implanted inside the p-type well region 7; the first N+ contact region 1 and the first P+ contact region 2 located within the p-type body region 3 are shorted with the first P+ contact region 2 located within the p-type well region 7 through the source metal 11.

The advantage of this embodiment is that the $C_{gd}$ of the device can be further reduced, and the latch-up resistance of the device can be enhanced.

Embodiment 9

Figure 10:
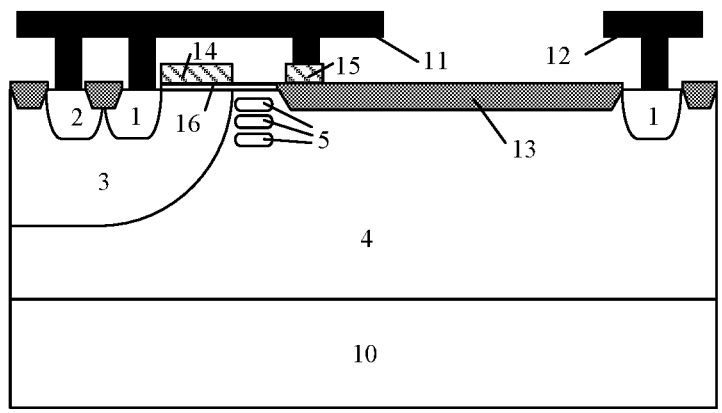
FIG. 10 is a longitudinal cross-sectional view of Embodiment 9 of an integratable semiconductor device provided by the present invention.

As shown in FIG. 10, the difference between this embodiment and embodiment 5 lies in that: the polysilicon field plate 15 is located over the gate oxide layer 13; the polysilicon field plate 15 is shorted with the first N+ contact region 1 and the first P+ contact region 2 through the source metal 11.

The advantage of this embodiment is that the adverse effect of the polysilicon field plate 15 on the on-resistance of the device can be further reduced.

Embodiment 10

Figure 11:
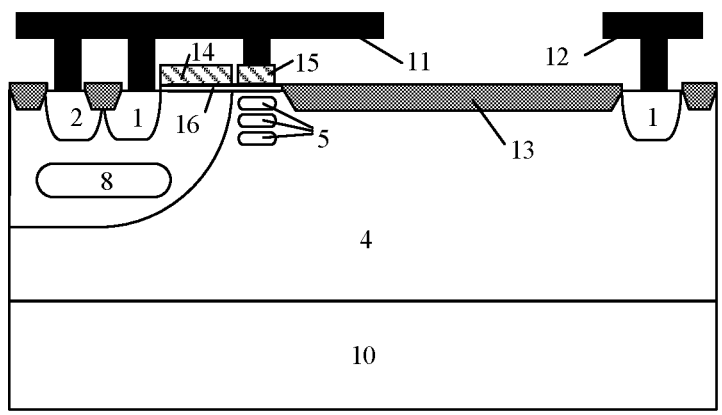
FIG. 11 is a longitudinal cross-sectional view of Embodiment 10 of an integratable semiconductor device provided by the present invention.

As shown in FIG. 11, the difference between this embodiment and embodiment 5 lies in that: a first buried layer (8) is added inside the p-type body region 3 and below the first N+ contact region 1 and the first P+ contact region 2. The advantage of this embodiment is that it can increase the latch-up resistance of the device.

Embodiment 11

Figure 12:
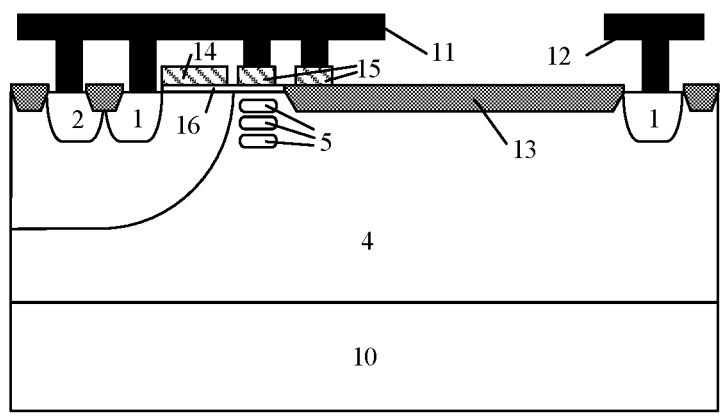
FIG. 12 is a longitudinal cross-sectional view of Embodiment 11 of an integratable semiconductor device provided by the present invention.

As shown in FIG. 12, the difference between this embodiment and Embodiment 5 lies in that: a polysilicon field plate 15 is provided over the first oxide layer 13; the two polysilicon field plates 15 are shorted with the first N+ contact region 1 and the first P+ contact region 2 through the source metal 11.

The advantage of this embodiment is that the robustness of the device against hot carrier effect can be further increased.

Embodiment 12

Figure 13:
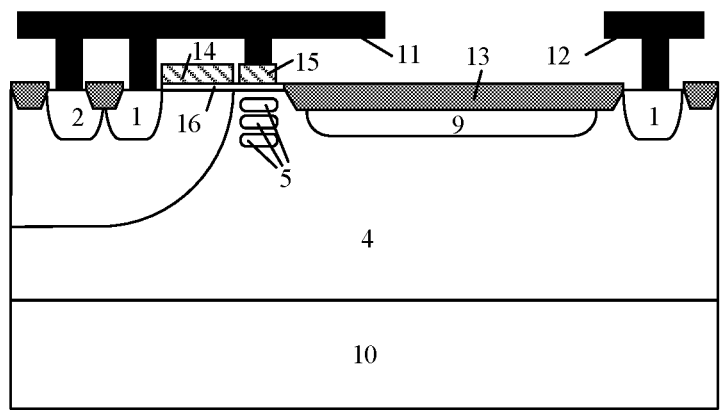
FIG. 13 is a longitudinal cross-sectional view of Embodiment 12 of an integratable semiconductor device provided by the present invention.

As shown in FIG. 13, the difference between this embodiment and embodiment 5 lies in that: a first type drift region implantation 9 is provided on the right side of the first type doped region 5 and below the first oxide layer 13.

The advantage of this embodiment is that it can further reduce the on-resistance of the device and can increase the robustness of the device against hot carrier effect.

The above embodiments illustrate only the principles and its efficacies of the present invention, and are not intended to limit the present invention. Modifications and variations can be made to the above-illustrated embodiments without departing from the spirit and scope of the present invention by anyone familiar with the art. Therefore, all equivalent modifications or changes made by those with known to persons of ordinary skill in the technical field without departing from the spirit and technical ideas disclosed in the present invention should still be covered by the claims of the present invention.

What is claimed is:

1. A power semiconductor device, comprising: a P-type substrate, an N-type well region located over the P-type substrate, a P-type body region located on a left side surface of the N-type well region, wherein
a first N+ contact region and a first P+ contact region are adjacent and both located on a surface of the P-type body region,
an another first N+ contact region is located on a right side surface of the N-type well region,
a gate oxide layer is located over the P-type body region and the N-type well region,
a polysilicon gate is located on an upper surface of the gate oxide layer,
a first oxide layer is located on a surface of the N-type well region, the first N+ contact region and the first P+ contact region are shorted through a source metal,
a drain metal is connected to the first N+ contact region on the right side surface of the N-type well region,
a first-type doped region is located on the surface of the N-type well region and below the gate oxide layer, and
a polysilicon field plate is located over the gate oxide layer between the P-type body region and the first oxide layer: the polysilicon field plate is shorted with the first N+ contact region and the first P+ contact region through the source metal: the polysilicon field plate is separated from silicon gate by a space on the upper surface of the gate oxide layer.

2. The power semiconductor device according to claim 1, wherein a right boundary of the P-type body region is flush with a right boundary of the polysilicon gate or exceeds the right boundary of the polysilicon gate.

3. The power semiconductor device according to claim 1, wherein the source metal is directly connected with the gate oxide layer.

4. The power semiconductor device according to claim 1. wherein the first-type doped region is formed jointly by multiple implantations.

5. The power semiconductor device according to claim 1, wherein the first-type doped region is formed by multiple ion implantations with different energies and doses.

6. The power semiconductor device according to claim 1. wherein the first-type doped region comprises a separated first-type doped region formed by two implantations, and a second-type doped region is implanted in a middle of the separated first-type doped region.

7. The power semiconductor device according to claim 6, wherein another first-type doped region is implanted over the first-type doped region formed by the two implantations and the second-type doped region.

8. The power semiconductor device according to claim 5, wherein a P-type well region is implanted on a right side of the first-type doped region, and the first P+ contact region is implanted inside the P-type well region; the first N+ contact region and the first P+ contact region located within the P-type body region are shorted with the first P+ contact region located in the P-type well region through the source metal.

9. The power semiconductor device according to claim 1, wherein a polysilicon field plate is located over the gate oxide layer; the polysilicon field plate is shorted with the first N+ contact region and the first P+ contact region through the source metal.

10. The power semiconductor device according to claim 5, wherein a first buried layer is added inside the P-type body region and below the first N+ contact region and the first P+ contact region.

11. The power semiconductor device according to claim 5, wherein a first polysilicon field plate is provided over the gate oxide layer between the P-type body region and the first oxide layer, and a second polysilicon. field plate is provided over the first oxide layer, the first polysilicon field plate and the first polysilicon field plate are shorted with the first N+ contact region and the first P+ contact region through the source metal.

12. The power semiconductor device according to claim 5, wherein a first type drift region inject is provided on a right side of the first-type doped region and below the first oxide layer.

13. The power semiconductor device according to claim 1, wherein the P-type substrate is a bulk silicon substrate or an SOI substrate.

14. The power semiconductor device according to claim 1, wherein a right boundary of the P-type body region is flush with a right boundary of the polysilicon gate or exceeds the right boundary of the polysilicon gate.

15. The power semiconductor device according to claim 1, wherein the first-type doped region is formed jointly by multiple implantations.

16. The power semiconductor device according to claim 7, wherein a P-type well region is implanted on a right side of the first-type doped region, and the first P+ contact region is implanted inside the P-type well region; the first N+ contact region and the first P+ contact region located within the P-type body region are shorted with the first P+ contact region located in the P-type well region through the source metal.

17. The power semiconductor device according to claim 2, wherein the P-type substrate is a bulk silicon substrate or an SOT substrate.

18. The power semiconductor device according to claim 3, wherein the P-type substrate is a bulk silicon substrate or an SOT substrate.

* * * * *